United States Patent
Chung et al.

(10) Patent No.: US 9,391,115 B1
(45) Date of Patent: Jul. 12, 2016

(54) CMOS IMAGE SENSOR UNIT AND METHOD FOR FABRICATING THE SAME

(71) Applicant: Powerchip Technology Corporation, Hsinchu (TW)

(72) Inventors: Chih-Ping Chung, Hsinchu (TW); Ming-Wei Chen, Changhua County (TW); Min-Hui Chen, Hsinchu County (TW); Ming-Yu Ho, Taichung (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/740,282

(22) Filed: Jun. 16, 2015

(30) Foreign Application Priority Data

Apr. 15, 2015 (TW) .............................. 104112060 A

(51) Int. Cl.
*H01L 27/00* (2006.01)
*H01L 27/146* (2006.01)

(52) U.S. Cl.
CPC .... *H01L 27/14643* (2013.01); *H01L 27/14612* (2013.01); *H01L 27/14689* (2013.01)

(58) Field of Classification Search
CPC .................. H01L 27/14643; H01L 27/14612; H01L 27/14689; H01L 27/14609; H01L 27/14601

See application file for complete search history.

(56) References Cited

U.S. PATENT DOCUMENTS

| 7,078,746 B2 | 7/2006 | Hong |
| 7,847,847 B2 | 12/2010 | Yaung et al. |
| 7,884,401 B2 | 2/2011 | Shim |
| 2004/0251394 A1 | 12/2004 | Rhodes et al. |
| 2007/0145447 A1* | 6/2007 | Lee ...................... H04N 5/3559 257/292 |
| 2011/0267505 A1* | 11/2011 | Dierickx ................ H04N 5/357 348/241 |

\* cited by examiner

*Primary Examiner* — Nikolay Yushin
(74) *Attorney, Agent, or Firm* — Jianq Chyun IP Office

(57) ABSTRACT

A CMOS image sensor unit and a method for fabricating the same are described. The image sensor unit includes a photodiode, a transfer gate, a reset gate, a source follower gate, a floating drain region between the transfer gate and the reset gate, and a PIP capacitor. The lower poly-Si electrode of the PIP capacitor is electrically connected with the floating drain region and the source follower gate to also serve as an interconnect between the floating drain region and the source follower gate. The fabrication method includes forming contact plugs on the floating drain region and the source follower gate, and then forming a PIP capacitor whose lower poly-Si electrode is connected with each contact plug.

8 Claims, 3 Drawing Sheets

CMOS IMAGE SENSOR UNIT AND METHOD FOR FABRICATING THE SAME

CROSS-REFERENCE TO RELATED APPLICATION

This application claims the priority benefits of Taiwan Application serial no. 104112060, filed on Apr. 15, 2015. The entirety of the above-mentioned patent application is hereby incorporated by reference herein and made a part of this specification.

BACKGROUND

1. Field of the Invention

The invention is directed to an image sensor unit, and more particularly to a CMOS image sensor unit and a method for fabricating the same.

2. Description of Related Art

A typical CMOS image sensor unit includes a photodiode (PD), a transfer gate, a reset gate, a source follower gate, and a floating drain region (FD) between the transfer gate and the reset gate. The floating drain region is electrically connected with the source follower gate through a metal interconnect. During the operation, the charges generated from the photodiode having received a light signal flows to the floating drain region through the channel controlled by the transfer gate to influence the magnitude of the current of the channel controlled by the source follower gate which is electrically connected with the floating drain region, such that the intensity of the light signal can be derived.

However, for the capacitance ($C_{PD}$) of the entire photodiode region is larger than that ($C_{FD}$) of the floating drain region, charges generated in the photodiode are difficult to totally transfer to the floating drain region during the period of switching on the transfer transistor. Thus, after the transfer transistor is switched off, some charges remain in the photodiode and lead to an image lag. Therefore, the dynamic range of image sensing is limited.

In a solution in the prior art, a metal/insulator/metal capacitor coupled to the floating drain region is added to increase the capacitance of the floating drain region. However, if doing so, an additional area is occupied reducing the fill factor. Additionally, in the conventional structure, current signal transmission between the floating drain region and the source follower gate passes through the hetero junction between the metal and the silicon in the interconnect. The leakage existing in the hetero junction easily causes a dark current during the image sensing, so that noise is formed during signal sensing.

SUMMARY

The invention provides a CMOS image sensor unit capable of increasing the dynamic range as well as reducing the dark current, without reducing the fill factor.

The invention provides a method fabricating the CMOS image sensor unit.

The CMOS image sensor unit of the invention includes a photodiode, a transfer gate, a reset gate, a floating drain region, a source follower gate and a poly-Si/insulator/poly-Si (PIP) capacitor. The photodiode is disposed in a semiconductor substrate. The transfer gate is disposed on the semiconductor substrate next to the photodiode. The reset gate is disposed on the semiconductor substrate. The floating drain region is disposed in the semiconductor substrate between the transfer gate and the reset gate. The source follower gate is disposed on the semiconductor substrate. The lower poly-Si electrode of the PIP capacitor is electrically connected with the floating drain region and the source follower gate to also serve as an interconnect between the floating drain region and source follower gate.

In an embodiment of the CMOS image sensor unit, the lower poly-Si electrode is electrically connected with the floating drain region and the source follower gate respectively via different poly-Si contact plugs.

The method for fabricating a CMOS image sensor unit of the invention is described below. A semiconductor substrate is provided, wherein a transfer gate, a reset gate and a source follower gate are formed on the substrate, a photodiode and a floating drain region are formed in the substrate, the transfer gate is disposed next to the photodiode, and the floating drain region is disposed between the transfer gate and the reset gate. A plurality of contact plugs is formed above the floating drain region and source follower gate. A PIP capacitor is then formed, of which the lower poly-Si electrode is connected with the contact plugs to also serve as an interconnect between the floating drain region and the source follower gate.

In an embodiment of the method, forming the contact plugs above the floating drain region and the source follower gate and forming the PIP capacitor include the following steps. An insulating layer is formed on the substrate. A plurality of contact openings is formed in the insulating layer above the floating drain region and source follower gate. A first poly-Si layer is formed filling in the contact openings to form the contact plugs. A dielectric layer and a second poly-Si layer are sequentially formed on the first poly-Si layer. The second poly-Si layer, dielectric layer and first poly-Si layer are patterned to form the PIP capacitor.

In the invention, the lower electrode of PIP capacitor also serves as the interconnect between the floating drain region and the source follower gate, i.e., the PIP capacitor coupled to the floating drain region is formed in the area that is occupied by the interconnect in the prior art. Thereby, the capacitance of the floating drain region and the dynamic range can be increased without reducing the fill factor. Moreover, when the lower poly-Si electrode or interconnect is electrically connected with the source follower gate and floating drain region via poly-Si contact plugs, the semiconductor substrate is made of doped monocrystalline silicon, and the gates including the source follower gate are made of doped poly-Si, the homo-junction provided between silicon and silicon contributes to reduce the dark current.

In order to make the aforementioned and other features and advantages of the invention more comprehensible, several embodiments accompanied with figures are described in detail below.

BRIEF DESCRIPTION OF THE DRAWINGS

FIGS. 1 to 5 are cross-sectional views showing a method for fabricating an image sensor unit according to an embodiment of the invention, wherein FIG. 5 is a cross-sectional view of the image sensor unit of the embodiment.

DESCRIPTION OF EMBODIMENTS

An embodiment is provided to illustrate the invention, but is not intended to limit the same. For instance, even though in this embodiment a 4-transistor (4T) CMOS image sensor unit including a transfer gate, a reset gate, a source follower gate and a row select gate (RS gate) is described, other type of CMOS image sensor unit may be applied as long as having the base structure containing a photodiode, a transfer gate, a reset gate, a floating drain region and a source follower gate.

Figure 3:
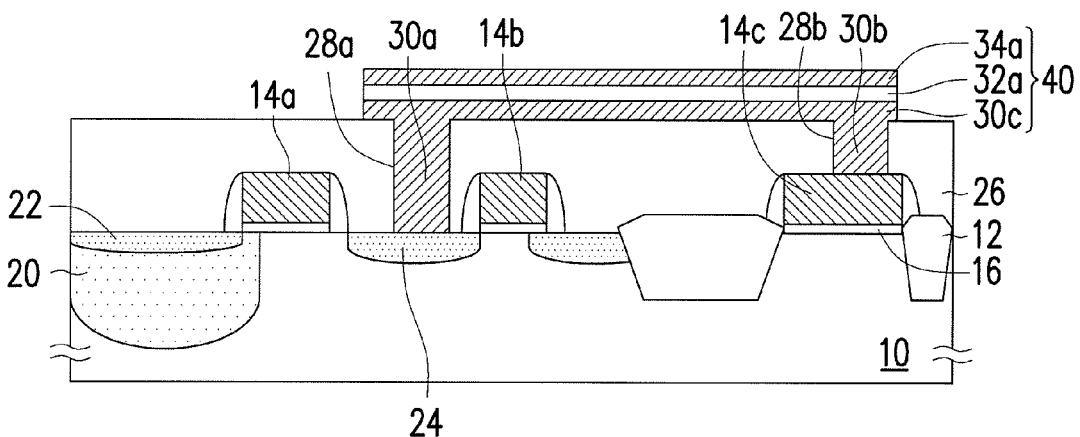
Figure 4:
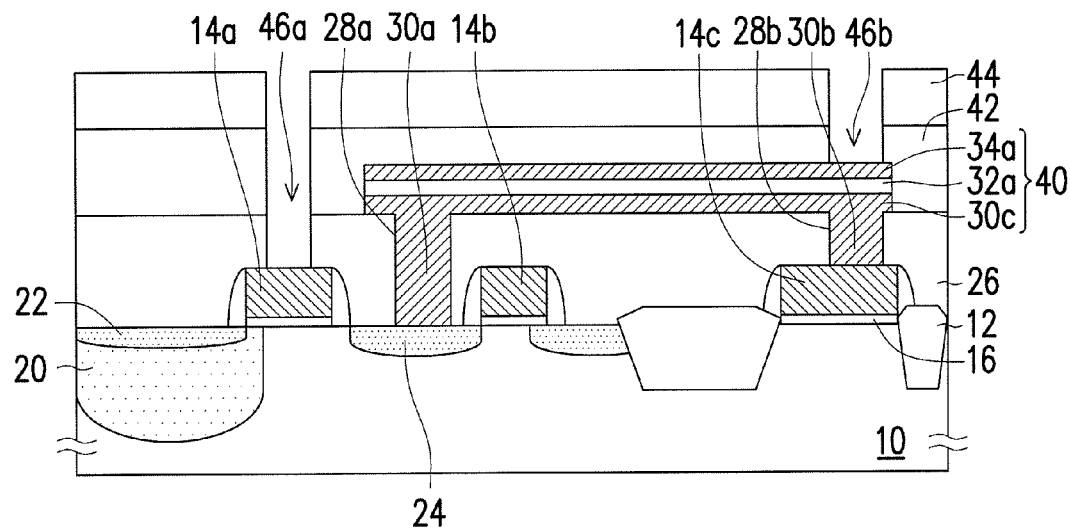
Figure 5:
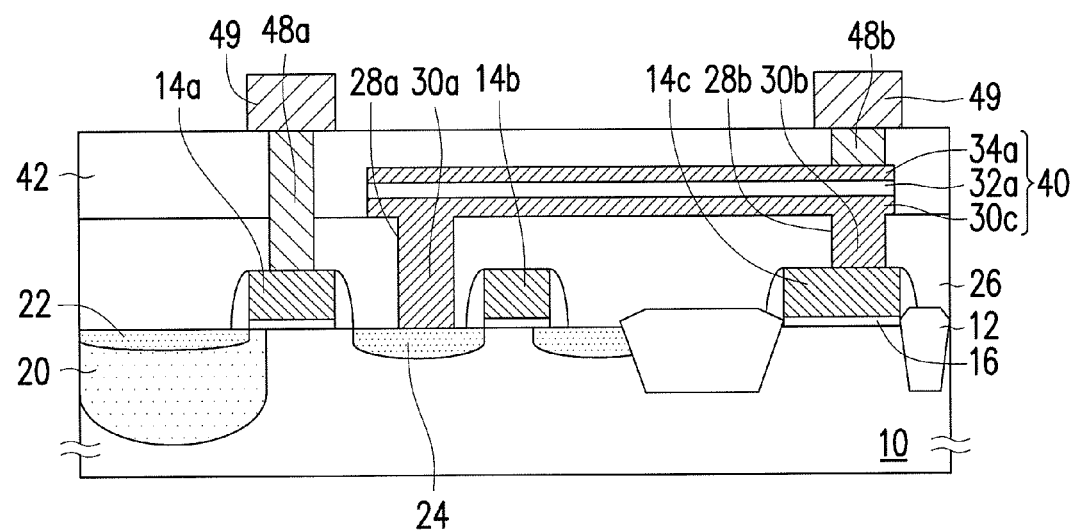

FIGS. 1 to 5 are cross-sectional views showing a method for fabricating an image sensor unit according to an embodiment of the invention, wherein FIG. 5 is a cross-sectional view of the image sensor unit of the embodiment.

Figure 1:
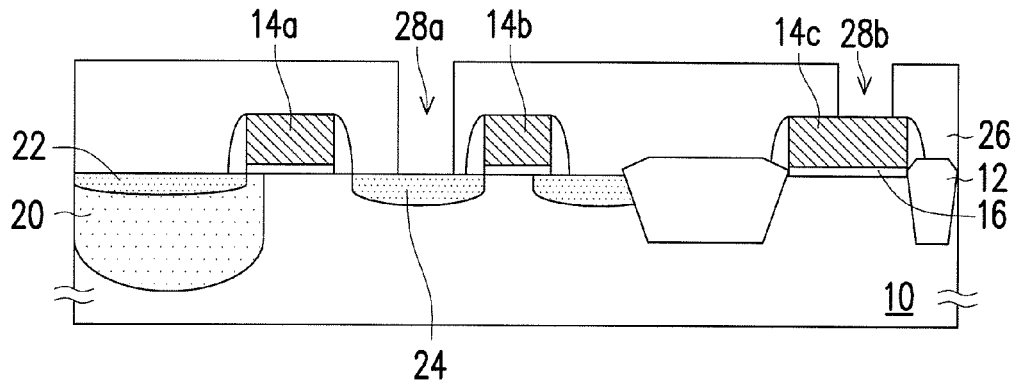

Referring to FIG. 1, a semiconductor substrate 10 is provided, which includes, for example, doped monocrystalline silicon, and has a conductivity type of, for example, P-type. An isolation layer 12 is formed on the semiconductor substrate 10 to define an active region, and a transfer gate 14a, a reset gate 14b, a source follower gate 14c and an RS gate (which is not shown in FIG. 1, but shown in FIG. 6 as "14d"). Each gate is separated from the semiconductor substrate 10 by a gate dielectric layer 16. The gate dielectric layer 16 includes, for example, silicon dioxide, silicon nitride, silicon oxide-silicon nitride-silicon oxide (ONO), or other single-layer or multi-layer stacked isolation layer. Each gate includes, for example, doped poly-Si. A photodiode 20 and a floating drain region 24 are formed in the semiconductor substrate 10. The conductivity type of the photodiode 20 and the floating drain region 24 is, for example, N-type, where the photodiode 20 is a lightly doped region. The transfer gate 14a is disposed next to the photodiode 20, and the floating drain region 24 is disposed between the transfer gate 14a and the reset gate 14b. A pinning layer 22 may be further forming in the semiconductor substrate 10 on the photodiode 20 to increase the response to a short wavelength (e.g., blue light) and to elevate the amount of charges in the photodiode region. When the conductivity type of the photodiode 20 is N-type, the conductivity type of the pinning layer 22 on the photodiode 20 is P-type.

Afterwards, an insulating layer 26 covering the aforementioned structure is formed, and contact openings 28a and 28b are then formed in the insulating layer 26 over the floating drain region 24 and the source follower gate 14c. When the contact opening 28b is being formed on the source follower gate 14c, slight over-etching may be performed on the source follower gate 14c to ensure the stability of the process window.

Figure 2:
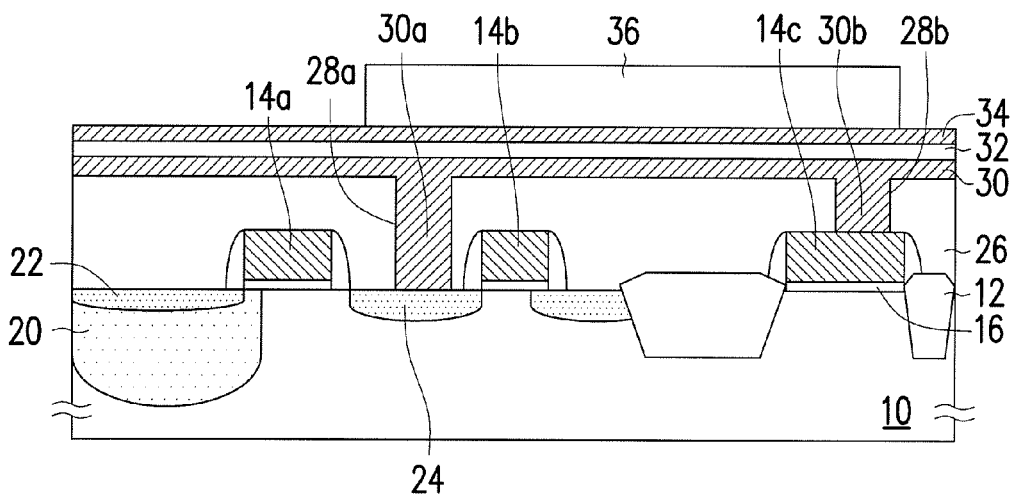

Referring to FIG. 2, a first poly-Si layer 30 is formed filling in the contact openings 28a and 28b to form contact plugs 30a and 30b. A dielectric layer 32 is then formed on the first poly-Si layer 30, including, for example, silicon dioxide, silicon nitride, silicon oxide-silicon nitride-silicon oxide (ONO), or any single-layer or multi-layer stacked insulating layer. Thereafter, a second poly-Si layer 34 is formed on the dielectric layer 32. A patterned photoresist layer 36 is then formed above the second poly-Si layer 34, having a pattern of a PIP capacitor (or an interconnect between the floating drain region and the source follower gate) which is to be formed.

Referring to FIG. 3, the second poly-Si layer 34, the dielectric layer 32 and the first poly-Si layer 30 is patterned using the patterned photoresist layer 36 as a mask to form a poly-Si/insulator/poly-Si (PIP) capacitor 40 including a lower poly-Si electrode 30c, a patterned dielectric layer 32a and an upper poly-Si electrode 34a. The lower poly-Si electrode 30c is electrically connected with the floating drain region 24 and the source follower gate 14c though the contact plugs 30a and 30b, and also serves as an interconnect between the floating drain region 24 and the source follower gate 14c.

Referring to FIG. 4, an insulating layer 42 is formed covering the aforementioned structure, and a patterned photoresist layer 44 having patterns of the contact openings to be formed is formed on the insulating layer 42. Then, using the patterned photoresist layer 44 as a mask, contact openings 46a and 46b are formed in the insulating layer 26+42 over the transfer gate 14a and the upper poly-Si electrode 34a, respectively. When the contact opening 46a is being formed on the transfer gate 14a, slight over-etching may be performed on the transfer gate 14a to ensure the stability of the process window.

Referring to FIG. 5, a metal material, e.g., tungsten, is filled in the contact openings 46a and 46b to form metal contact plugs 48a and 48b. Then, a first metal interconnect 49 is formed and connected with the metal contact plugs 48a and 48b. The first metal interconnect 49 is formed, for example, by depositing and etch-defining a tungsten metal layer or an AlCu layer, or by a Cu process.

Though the electrical connection structure required by the upper poly-Si electrode 34a and the transfer gate 14a is fabricated by a process of forming contact openings, filling in a metal material and then forming a first metal interconnect to connect the metal contact plugs, the invention is not limited thereto. For example, the first metal interconnect connected with the metal contact plugs may alternatively be formed by forming contact openings, depositing a metal material filling in the contact openings and covering the insulating layer 42 in a certain thickness, and then performing a first metal patterning process. In such case, the metal material being used is, for example, tungsten.

Figure 6:
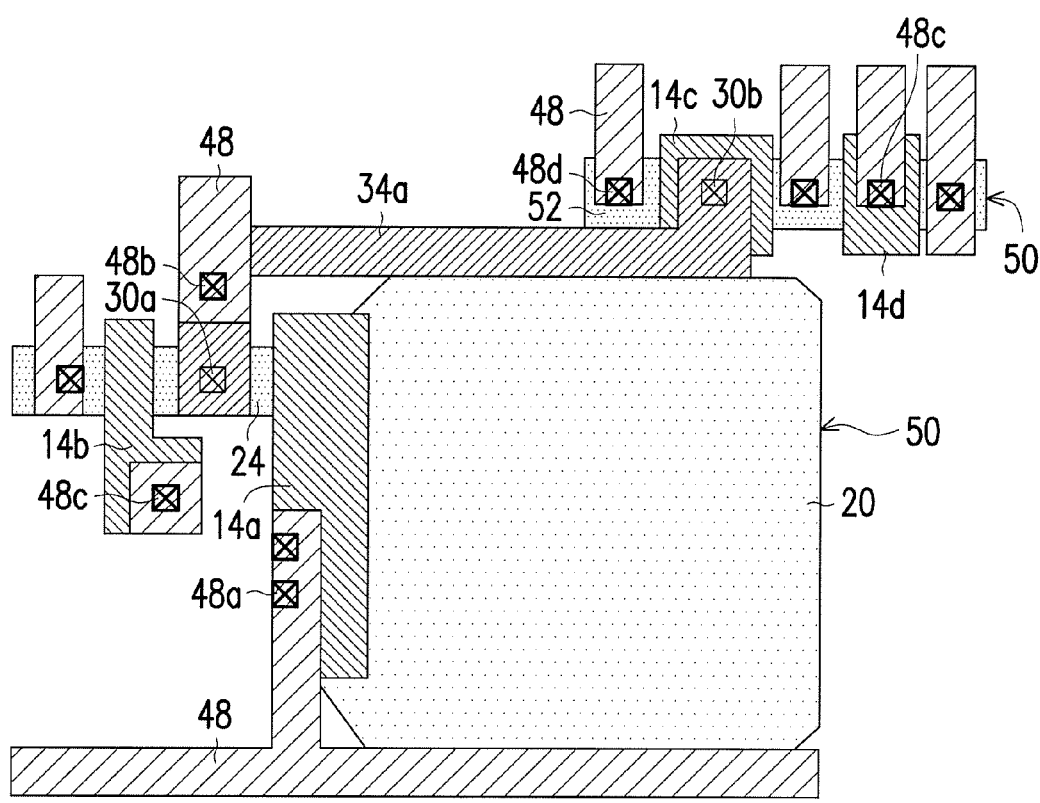
FIG. 6 illustrates an exemplary layout of the image sensor unit of the embodiment.

An exemplary layout of the image sensor unit is as illustrated in FIG. 6, but construes no limitations to the layout of the image sensor unit of the invention.

Referring to FIGS. 5 and 6, in the exemplary layout, the transfer gate 14a is disposed on the semiconductor substrate 10 at a first side of the photodiode 20, and the source follower gate 14c is disposed above the semiconductor substrate 10 at a second side of the photodiode 20, wherein the second side is next to the first side, for example. The PIP capacitor 40 mostly extends along the second side, for example.

FIG. 6 also illustrates the RS gate 14d, an active region 50, source/drain regions 52 other than the floating drain region 24, metal contact plugs 48c above the reset gate 14b and the RS gate 14d, and metal contact plugs 48d on the other source/drain regions 52.

Though this embodiment exemplifies the layout shown in FIG. 6, a person of ordinary skill in the art should understand that there may be a variety of changes in the relative position between the respective gates and the photodiode, such that the shape or the position of the interconnect 30c or the PIP capacitor 40 between the floating drain region 24 and the source follower gate 14c may also have a variety of changes.

In this embodiment, the lower electrode 30c of the PIP capacitor 40 also serves as the interconnect between the floating drain region 24 and the source follower gate 14c, i.e., the PIP capacitor 40 coupled to the floating drain region 24 is formed in the area that is occupied by the interconnect in the prior art, so the capacitance of the floating drain region 24 and the dynamic range can be increased without reducing the fill factor. In the meantime, since the lower poly-Si electrode/interconnect 30c is electrically connected with the source follower gate 14c and the floating drain region 24 via the poly-Si contact plugs 30a and 30b, when the semiconductor substrate 10 where the floating drain region 24 is disposed and the gates including the source follower gate 14c are both made of silicon, a homo-junction is provided between the contact plugs 30a/30b and the floating drain region 24/source follower gate 14c so that the dark current is reduced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A CMOS image sensor unit, comprising:
   a photodiode, disposed in a semiconductor substrate;
   a transfer gate, disposed on the semiconductor substrate next to the photodiode;
   a reset gate, disposed on the semiconductor substrate;
   a floating drain region, disposed in the semiconductor substrate between the transfer gate and the reset gate;
   a source follower gate, disposed on the semiconductor substrate; and
   a poly-Si/insulator/poly-Si (PIP) capacitor, having a lower poly-Si electrode electrically connected with the floating drain region and the source follower gate to also serve as an interconnect between the floating drain region and the source follower gate,
   wherein the lower poly-Si electrode is electrically connected with the floating drain region and the source follower gate respectively via different poly-Si contact plugs.

2. The CMOS image sensor unit of claim 1, wherein the semiconductor substrate comprises doped monocrystalline silicon, and the transfer gate, the reset gate and the source follower gate comprises doped poly-Si.

3. The CMOS image sensor unit of claim 1, wherein the transfer gate is disposed on the semiconductor substrate at a first side of the photodiode, and the source follower gate is disposed on the semiconductor substrate at a second side of the photodiode.

4. The CMOS image sensor unit of claim 1, further comprising:
   a pinning layer, disposed in the semiconductor substrate on the photodiode.

5. A method for fabricating a CMOS image sensor unit, comprising:
   providing a semiconductor substrate, wherein a transfer gate, a reset gate and a source follower gate are formed on the semiconductor substrate, a photodiode and a floating drain region are formed in the semiconductor substrate, the transfer gate is disposed next to the photodiode, and the floating drain region is disposed between the transfer gate and the reset gate;
   forming a plurality of contact plugs above the floating drain region and the source follower gate; and
   forming a poly-Si/insulator/poly-Si (PIP) capacitor having a lower poly-Si electrode electrically connected with the contact plugs to also serve as an interconnect between the floating drain region and the source follower gate,
   wherein forming the contact plugs above the floating drain region and the source follower gate and forming the poly-Si/insulator/poly-Si capacitor comprise:
   forming an insulating layer on the semiconductor substrate;
   forming a plurality of contact openings in the insulating layer above the floating drain region and the source follower gate;
   forming a first poly-Si layer filling in the contact openings to form the contact plugs;
   forming a dielectric layer on the first poly-Si layer;
   forming a second poly-Si layer on the dielectric layer; and
   patterning the second poly-Si layer, the dielectric layer and the first poly-Si layer to form the poly-Si/insulator/poly-Si capacitor.

6. The method of claim 5, wherein the semiconductor substrate comprises doped monocrystalline silicon, and the transfer gate, the reset gate and the source follower gate comprises doped poly-Si.

7. The method of claim 5, wherein the transfer gate is disposed on the semiconductor substrate at a first side of the photodiode, and the source follower gate is disposed on the semiconductor substrate at a second side of the photodiode.

8. The method of claim 5, wherein a pinning layer is further formed in the semiconductor substrate on the photodiode.

* * * * *